United States Patent
Kindt (10) Patent No.: US 7,132,206 B2
(45) Date of Patent: Nov. 7, 2006

(54) PROCESS AND APPARATUS FOR MINIMIZING THERMAL GRADIENTS ACROSS AN ADVANCED LITHOGRAPHIC MASK

(75) Inventor: Louis M. Kindt, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/065,095

(22) Filed: Sep. 17, 2002

(65) Prior Publication Data

US 2004/0053169 A1 Mar. 18, 2004

(51) Int. Cl.
*G03F 9/00* (2006.01)

(52) U.S. Cl. ............................................ 430/30; 430/5

(58) Field of Classification Search .................... 430/5, 430/30

See application file for complete search history.

(56) References Cited

U.S. PATENT DOCUMENTS 6,228,540 B1 * 5/2001 Kobayashi .................... 430/5
6,626,236 B1 * 9/2003 Bandoh et al. ............. 165/206

* cited by examiner

*Primary Examiner*—Christopher G. Young
(74) *Attorney, Agent, or Firm*—Richard M. Kotulak (57) ABSTRACT

A method and system to minimize the affects of thermal gradient distortion in reticles. A heat source and filter or filters are used to control which part or parts of the reticle receive additional radiation. The heat created by this additional radiation minimizes any thermal gradients across the mask by supplying a constant heat flux to the entire surface of the mask. The heat source can also be used to preheat the reticle to minimize any transient start-up effects.

14 Claims, 7 Drawing Sheets

EUV Reticle
- High dense pattern
- Medium dense pattern
- Low dense pattern
- Clear pattern

Figure 4c

Filter A - Illumination Pattern
- Opaque pattern
- Clear pattern

Filter B - Complimentary Pattern
- High dense / opaque pattern
- Medium / high dense pattern
- Medium dense pattern
- Low dense / clear pattern

PROCESS AND APPARATUS FOR MINIMIZING THERMAL GRADIENTS ACROSS AN ADVANCED LITHOGRAPHIC MASK

BACKGROUND OF THE INVENTION

1. Field of the Invention

This invention relates to advanced lithographic masks. Particularly, it relates to projection lithography employing soft x-ray radiation or extreme ultraviolet (EUV) radiation and, more particularly, to methods and systems that provide for the reduction of thermal gradients on extreme ultraviolet lithography (EUVL) reticles during scanning.

2. Background of the Invention

Extreme ultraviolet lithography is a leading candidate for the production of integrated circuits with feature sizes of 65 nm and below. EUVL is different from other lithographic technologies in that it is based on reflective lithographic technologies when compared to conventional transmissive optical lithography. In a simplified description of this technology, a patterned EUVL mask is exposed to EUV or soft x-ray radiation and the corresponding pattern is eventually reflected rather than transmitted onto a resist coated substrate, where the resist is exposed and the desired pattern is formed.

An EUVL mask consists of an absorbing film deposited on a multilayer reflective coating which is deposited on a substrate. Additional films such as a buffer layer or etch stop layer can be deposited between the multilayer stack and absorber film to aid in certain aspects of the mask manufacturing process if desired. The substrate is typically a material that has very low thermal expansion characteristics. The multilayer reflective coating is a Bragg mirror consisting of 40 bilayers of silicon and molybdenum. The use of silicon and molybdenum as the bilayers is specifically optimized for a peak EUV reflectivity wavelength of 13.4 nm. Other combinations, such as beryllium and silicon, can be used as well, although the peak reflectivity wavelength may differ. The absorber film is any element, compound, or alloy, such as chrome or tantalum nitride, deposited at a thickness such that over 99% of the EUV radiation is absorbed. To create a patterned mask, the absorber layer, as well as any underlying layers between the multilayer stack and absorber layer, are removed in specific areas by known manufacturing processes to create a desired pattern. Where the absorber and underlying layers are removed (the patterned area), the EUV radiation is reflected by the multilayer stack. Where the absorber remains (the unpatterned area), the EUV radiation is absorbed.

The entire mask is not exposed all at once, but the EUVL reticle is scanned across a segment of EUV radiation which exposes only a small portion of the mask, leaving the remainder of the mask unexposed. The radiation exposes both patterned and unpatterned areas.

The absorption of the radiation in the unpatterned areas can lead to noticeable temperature gradients on areas of the mask, which can produce mask distortion due to thermal expansion and consequently image size and placement errors. Modeling results from the University of Wisconsin have shown that thermal gradients of up to 1.9Å° C. can exist across an EUV mask during continuous exposure. For individual points on the mask, the simulation results indicated that temperature variations up 0.48Å° C. can exist due to the localized heating and cooling during the exposure. These results also indicated that in-plane displacements (IPD) can be up to 1.33 nm. Magnification correction has been shown to reduce the IPD's. However, the cyclic heating and cooling during the exposure reduced its effectiveness as did changes in the pattern density. After magnification correction, the maximum IPD was simulated to be 0.6 nm. (See C. Martin, R. Englestad, E. Lovell, "Thermomechanical Modelling of an EUV Reticle During Exposure," Computational Mechanics Center, University of Wisconsin—Madison, Mar. 7, 2001.) Since these are simulation results, the trends of the results are more important rather than the actual numbers. Because the simulations are based on ideal assumptions and conditions, the actual values are expected to be somewhat higher.

Others have identified thermal gradients as a problem for EUV mask operation and have tried to solve it using substrate cooling or heating systems or processes. For example, European Patent Application EP 1 120 690 A2 and U.S. Pat. No. 6,098,408 issued to Levinson et al. provide such processes. These methods, however, can not account for various pattern densities across a mask. Others have attempted to solve this problem by selective placement or omission of coating on the reticle, for example, U.S. Pat. No. 6,316,150 issued to Gianoulakis et al.

BRIEF SUMMARY OF THE INVENTION

To solve the problem of thermal gradient distortion during EUV exposure, an additional heating source is used to heat the areas where the EUV radiation is not exposing the mask. A filter or filters are used to control which part or parts of the reticle receive this additional radiation. This effectively minimizes any thermal gradients across the mask by supplying a constant heat flux to the entire surface of the mask, creating more of a predictable and controllable steady state operation. This can also be used to minimize any transient effects due to start-up or pauses for wafer changes. With minimal or no thermal gradients across the mask, image placement and size errors can be reduced significantly or at least reduced enough so that magnification correction can be effective. To control the mask from overheating, a heat sink may have to be used to remove the added heat from the mask (these techniques are well known).

BRIEF DESCRIPTION OF THE SEVERAL VIEWS OF THE DRAWINGS

$$H = mC_p(T_2 - T_1)$$

DETAILED DESCRIPTION OF THE INVENTION

Figure 1:
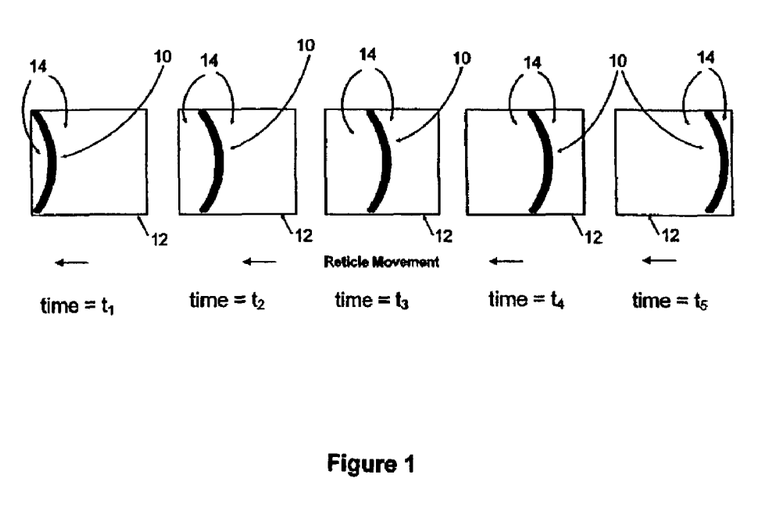
FIG. 1 illustrates a typical way in which an EUVL reticle is exposed to EUV radiation.

FIG. 1 illustrates a typical way an EUVL reticle is exposed to EUV radiation. For most systems reticle 12 is moved across the field exposed by the projection optics. As the EUV reticle surface is scanned across the EUV exposure field, areas are created where the reticle is exposed to EUV radiation and areas that are not exposed to EUV radiation, creating localized heating (areas 10 exposed to EUV radiation) and cooling (areas 14 not exposed to EUV radiation) phenomenon. This causes temperature gradients across the mask, which can ultimately affect image size and placement due to thermal expansion of the mask substrate. To mitigate these image size and placement errors, the thermal gradient between areas 10 and 14 needs to be minimized. Since area 10 is receiving heat from the EUV radiation from the lithography process, the other areas of the EUV reticle designated by 14 are the proposed areas for the additional heat source. As illustrated, the section of the mask exposed to radiation 10 and the areas 14 that are not exposed vary as a function of time as the reticle is moved across the EUV exposure field.

Figure 2:
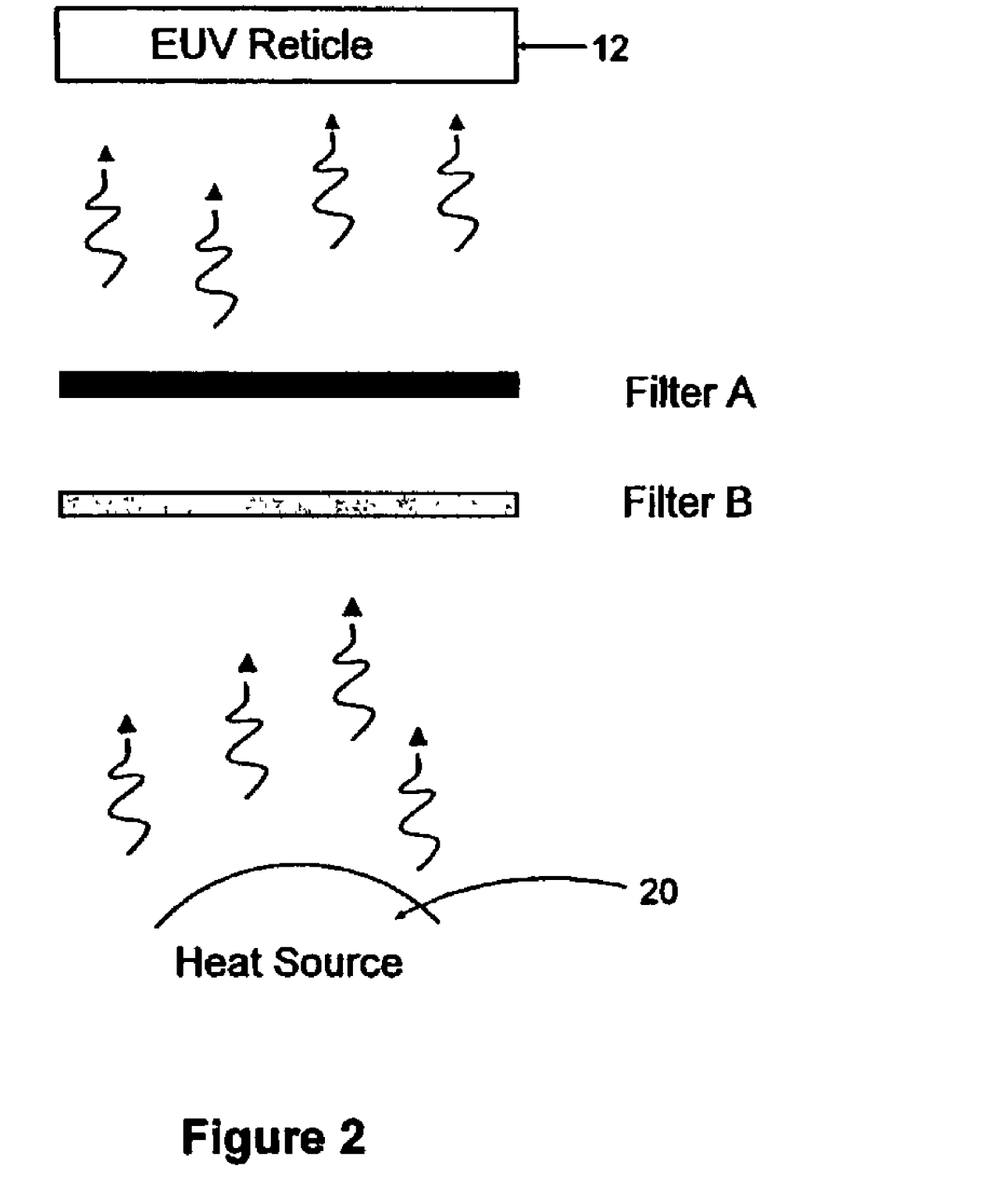
FIG. 2 illustrates schematically how the invention is intended to solve the problem of thermal gradients on EUV reticle.

FIG. 2 illustrates schematically how the invention is intended to solve the problem of thermal gradients on EUV reticle. By supplying an additional heat source 20 to the areas of the mask that aren't exposed to EUV radiation, a constant heat flux can be supplied to the mask surface, minimizing any temperature gradients across the mask surface. This is done through one or more filters, illustrated as Filter A and Filter B in FIG. 2.

Figure 3:
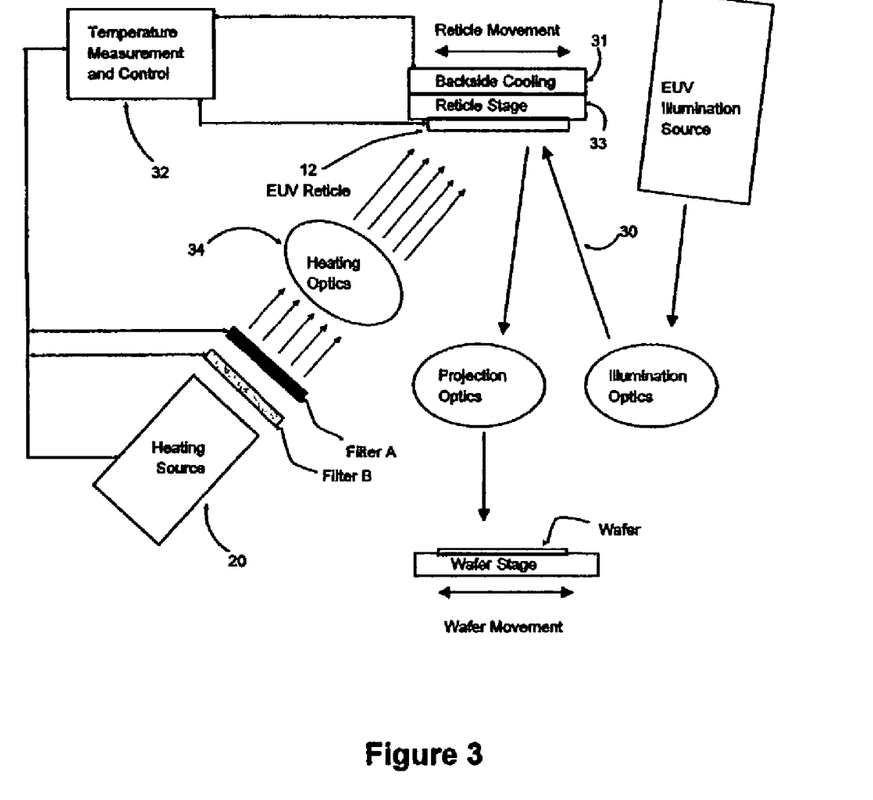
FIG. 3 illustrates from a system standpoint how the invention would operate in an EUV lithography environment.

FIG. 3 illustrates an example system how the invention would operate in an EUV lithography environment. As the EUVL reticle 12 is scanned across the EUV exposure field, additional heat through heating source 20 will be supplied to the non-EUV exposed areas (14 in FIG. 1) through optics 34 and Filters A and B in such a manner to maintain the surface of the mask at a constant temperature. Control device 32 both measures temperatures and controls cooling chuck 31 and heating source 21. It also synchronizes Filters A and B with the movement of the EUVL reticle 12 on reticle stage 33.

Calculations in table 1 below indicate that a 200 W heating source is adequate to maintain the reticle at a constant temperature. The calculations are based on crystalline and elemental densities and specific heat capacities, so the actual numbers may be somewhat lower. The calculations are based on the heat needed to raise the temperature of the EUVL reticle 1.9Å° C. in 50 seconds (shown by the University of Wisconsin to be the cycle time for the minimum and maximum temperatures due to heating and cooling during the exposure time). The total amount of heat needed was calculated using the basic formula: $H=mC_p(T_2-T_1)$ and summing the heat over all of the layers and the substrate where H is the enthalpy of the material, m is the mass of the material, $C_p$ is the specific heat capacity of the material, and $T_1$ and $T_2$ are the minimum and maximum temperatures of the material, respectively. According to Kirchhoff's Law, the emissivity and absorptivity of a given surface are equal at the same temperature. The absorptivity is simply the fraction of radiation that is absorbed from an external source. Consequently, the source heat needed is simply obtained by dividing the energy required to raise reticle 1.9Å° C. in 50 seconds by the absorptivity. In this case, the absorptivity of polished chrome was used. Most other materials have a larger absorptivity than polished chrome, which would correspondingly result in a lower amount of heat necessary to maintain the temperature.

TABLE 1

Example Calculations to Determine the Additional Heating Source Energy

| | |
|---|---|
| Absorber Specific Heat Capacity (Cr): | 0.449 J/g K |
| Absorber Density (Cr): | 7.190 g/cm$^3$ |
| Absorber Thickness (Cr): | 1.000E−07 m |
| Buffer Layer Specific Heat Capacity (SiO$_2$): | 0.959 J/g K |
| Buffer Layer Density (SiO$_2$): | 2.800 g/cm$^3$ |
| Buffer Layer Thickness (SiO$_2$): | 8.000E−08 m |
| Multi Layer Specific Heat Capacity (Si): | 0.7095 J/g K |
| Multi Layer Specific Heat Capacity (Mo): | 0.2472 J/g K |
| Multi Layer Density (Si): | 2.340 g/cm$^3$ |
| Multi Layer Density (Mo): | 10.200 g/cm$^3$ |
| Multi Layer Thickness (Si): | 1.393E−07 m |
| Multi Layer Thickness (Mo): | 1.427E−07 m |
| Substrate Specific Heat Capacity (SiO$_2$): | 0.959 J/g K |
| Substrate Density (SiO$_2$): | 2.600 g/cm$^3$ |
| Substrate Thickness (SiO$_2$): | 6.350E−03 m |
| Differential Temperature: | 1.9° C. |
| Exposure Time: | 50 sec |
| Plate Area: | 0.0232 m$^2$ |
| Absorbtivity (polished chrome @ T = 20° C.): | 0.075 |
| Energy Needed to be Absorbed by Absorber | 0.00028 W |
| Energy Needed to be Absorbed by Buffer | 0.00018 W |
| Energy Needed to be Absorbed by Multilayer: | 0.00032 W |
| Energy Needed to be Absorbed by Substrate: | 13.9740 W |
| TOTAL ENERGY NEEDED TO BE ABSORBED: | 13.9747 W |
| SOURCE ENERGY NEEDED: | 186.3 W |

The additional radiation for the non-EUV radiated areas will be at a wavelength and intensity that will effectively maintain a constant temperature across the surface of the mask when compared to the EUV radiated areas.

Figure 4A:
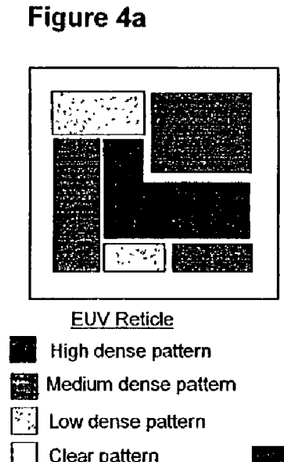
FIG. 4a illustrates graphically the density patterns of an example EUV mask.
Figure 4B:
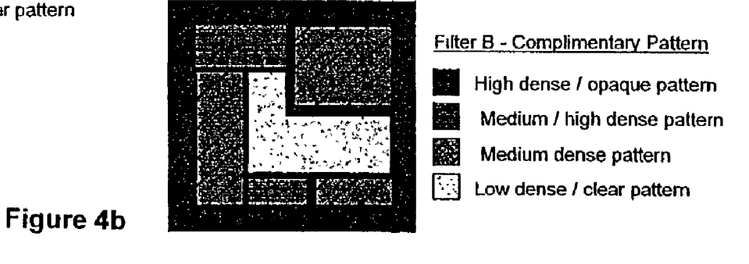
FIG. 4b illustrates graphically how the filter for the heat radiation is patterned to complement the density pattern of the mask.

The purpose of Filter B in FIG. 3 is to define a complimentary pattern to the EUV mask. Where the EUV mask is densely patterned (less absorber), the complimentary mask would be patterned lightly, letting more radiation through the complementary mask. Where the EUV mask is lightly patterned (more absorber), the complementary mask would have a denser pattern, restricting the radiation passing through it. In this manner, the densely patterned areas on the EUV mask would receive more heat than the lightly patterned area which would minimize any thermal gradients across the EUV mask due to different pattern densities. An example of a patterned mask and its complementary filter are illustrated in FIGS. 4a and 4b respectively. This filter could be something as simple as a chrome on glass optical mask or something more complex like a liquid crystal filter, which are akin to LCDs' used in projection TV systems.

Figure 4C:
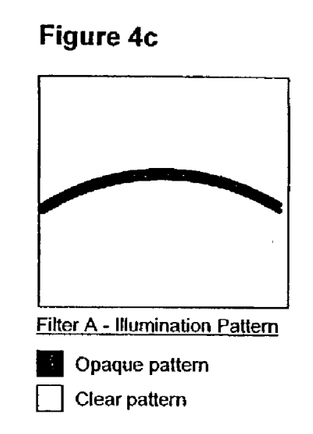
FIG. 4c illustrates graphically the illumination pattern of the illumination strip.

The purpose of Filter A as shown in FIG 4c is to provide the pattern of the illumination strip. The illumination strip is the actual EUV light that the EUVL mask is scanned across. Depending on the exposure system design, the pattern in this filter may or may not need the capability to move with the EUVL reticle and/or EUV illumination strip. The width and speed of this complimentary illumination pattern can be control variables. A liquid crystal filter would be adequate for this purpose.

Filter A or B can also be used to control the wavelength of light that passes to the EUVL reticle. This may be necessary during the transient start-up phase or mask preheat cycle, which would allow a different wavelength and or intensity of light that is transmitted to the reticle surface to achieve optimal heating results. This also may be necessary for extended exposure times. This can be done using filter technology such as acousto-optical filter and/or liquid crystal filters. This function of controlling the wavelength could just as easily be combined with Filter B providing that Filter B is an LCD filter. Further, these filters can be combined into one filter using LCD technology. This greatly simplifies the optical alignment of the system as well as reduce the overall cost of the heating system. However, this may complicate the control strategy. [See Organic-based electrically switchable Bragg gratings and their applications in photonics and telecommunications by Qian, S., Colegrove, J., Liu, P., Quan, X. Organic Photonic Materials and Devices III. Proceedings of SPIE—The International Society for Optical Engineering v. 4279 2001 p. 69–77, Optoelectronic switch and continuously tunable filter based on a liquid crystal waveguide by Sirleto, L., Coppola, G., D'Agata, A., Breglio, G., Integrated Optics Devices V, Proceedings of SPIE—The International Society for Optical Engineering v. 4277 2001 p. 320–327, and High resolution nematic pixel design by Gritsenko, M. I. and Kucheev, S. I., Proceedings of the 18th International Display Research Conference(Asia Display '98) Seoul, South Korea 28 Sep.–1 Oct. 1998, for further information on liquid crystals and their usage as filters.] These articles are herein incorporated by reference.

Figure 5:
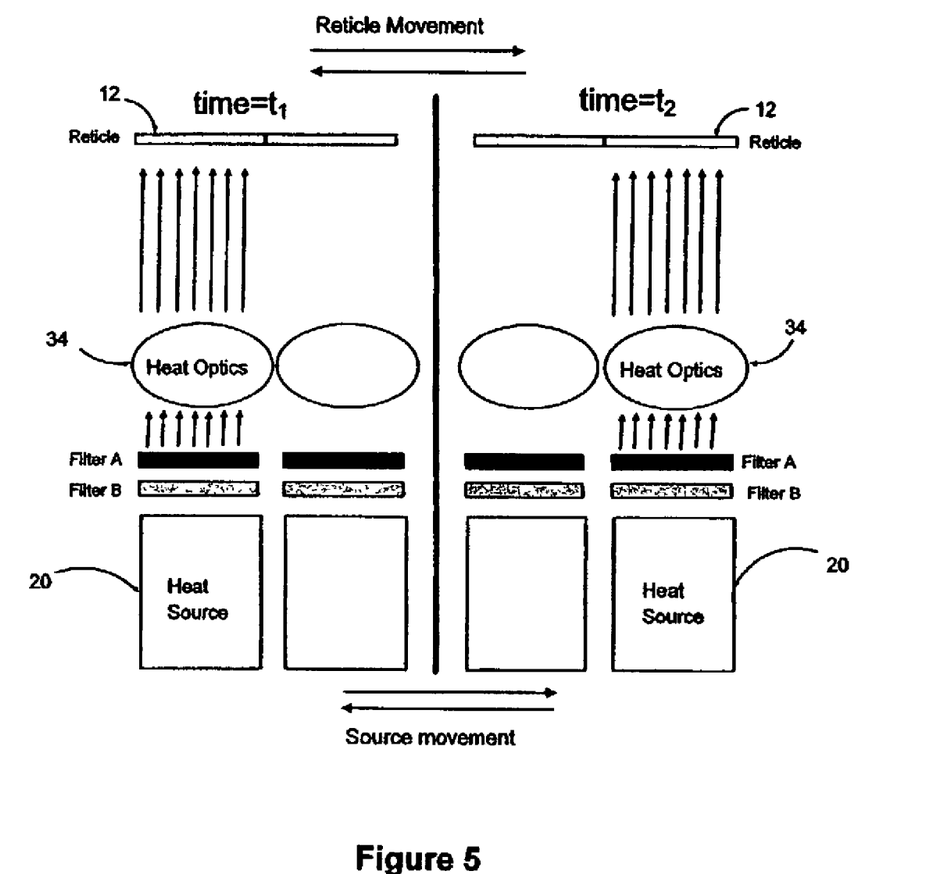
FIG. 5 illustrates in schematic form the heat source moving with the reticle.
Figure 6:
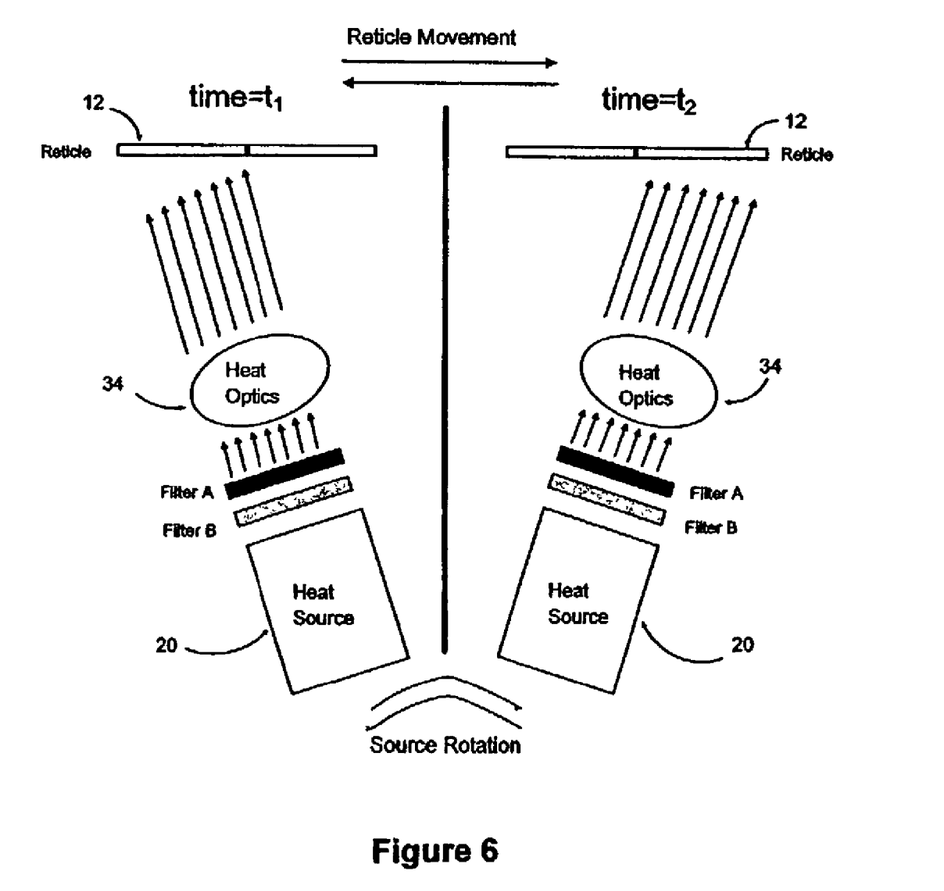
FIG. 6 illustrates in schematic form the heat source rotating to follow the reticle movement.
Figure 7:
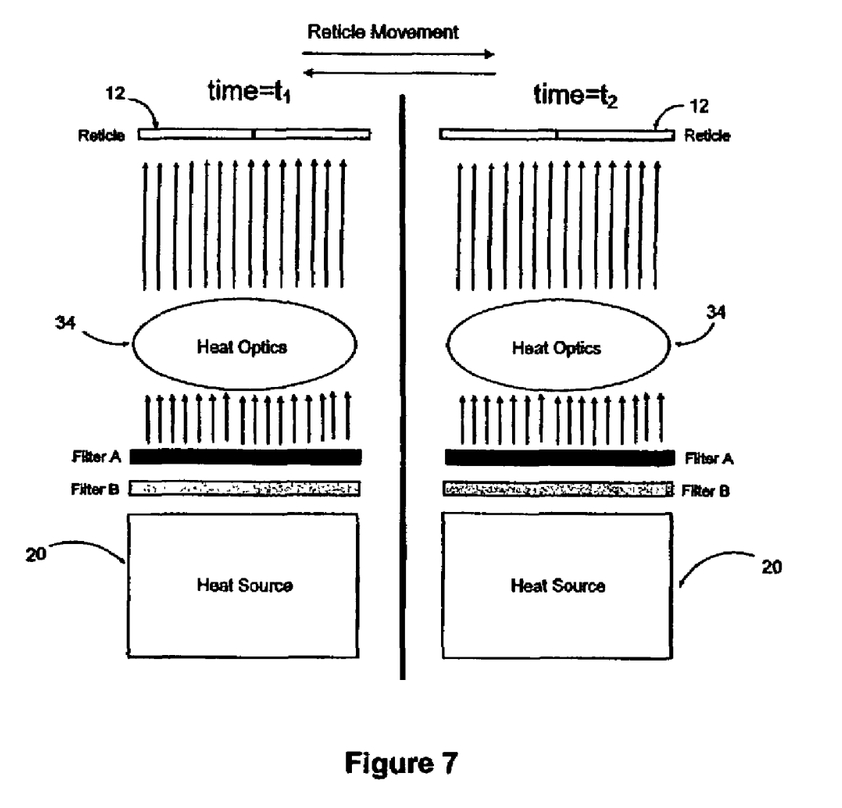
FIG. 7 illustrates in schematic form larger filters that use liquid crystal technology to create the moving pattern while the actual source remains stationary.

FIGS. 5–7 are different configurations for the heat source and Filters A and B to account for the moving reticle. The EUV light source is rather difficult to illustrate in these drawings since they are two dimensional. So the figures do not show the EUV light. However, in three dimensional terms if the EUV light is in the X-Z plane, then the heating source would be in the Y-Z plane. In all of these cases, Filter A or the pattern in Filter A may or may not move.

FIG. 5 illustrates in schematic form the heat source moving with the reticle. The pattern in Filter A or Filter A itself may not have to move at all since its function is to account for the stationary EUV illumination strip of the system.

FIG. 6 illustrates in schematic form the heat source rotating to follow the reticle movement.

FIG. 7 illustrates in schematic form larger Filters A and B that uses liquid crystal or like technologies to create the moving pattern while the actual source 20 remains stationary. Similar to above, the pattern for Filter A may not have to move at all since its function is to account for the stationary EUV illumination strip.

Although only preferred embodiments of the invention are specifically disclosed and described above, it will be appreciated that many modifications and variations of the present invention are possible in light of the above teachings and within the purview of the appended claims without departing from the spirit and intended scope of the invention. For example, instead of the reticle table moving as shown herein it is possible that the EUV illumination optics could move. Other variations could occur with the type of filters, number of filters, orientation of the heat source and other environmental conditions without departing from the spirit and claims of the invention. Also, this invention could apply to other lithography systems where such thermal gradient distortion may take place. For example, thermal distortion gradients may appear at the 157 nanometer level, as well.

What is claimed is:

1. A process for minimizing thermal gradients across a mask, comprising the steps of:
   applying a heat source to the mask through a filter; and
   operating the filter such that the radiation from the heat source passes to areas of the mask that are not being exposed to radiation from an exposure source while filtering heat to those areas of the mask which are subject thermal heating due to the radiation from the source exposure.

2. The process of claim 1 wherein the filter filters the radiation from the heat source such that the radiation from the heat source illuminates portions of the mask not illuminated by the exposure source comprising lithography system optics.

3. The process of claim 1 wherein the filter is comprised of a density pattern complimentary to the pattern density of the mask.

4. The process of claim 1 wherein the filter controls the wave length of the radiation from the heat source that passes through it.

5. The process of claim 2 wherein the filter is comprised of both a pattern that illuminates portions of the mask not illuminated by the lithography system optics and a density pattern complimentary to the pattern density of the mask.

6. The process of claim 5 wherein the filters are separate filters.

7. The process of claim 2 wherein the filter also controls the wavelength of light that passes through it.

8. The process of claim 1 wherein the filter is made from liquid crystal technology.

9. The process of claim 4 wherein the filter is an acousto-optic filter.

10. The process of claim 1 wherein the filter is an optical mask.

11. The process of claim 1 wherein the heat source moves in conjunction with reticle movement.

12. The process of claim 11 wherein the heat source movement is accomplished by rotation.

13. The process of claim 1 wherein the heat source source is stationary and the filter provides a pattern through liquid crystal technology.

14. A process for minimizing thermal gradients across an EUVL mask, comprising the steps of:
    applying a heat source to the mask through a filter; and
    operating the filter such that the heat from the heat source passes to areas of the mask that are not being exposed to radiation from an exposure source while filtering heat to those areas of the mask which are being exposed to radiation from the exposure source.

* * * * *